(12) United States Patent
Goorden et al.

(10) Patent No.: US 11,906,906 B2
(45) Date of Patent: Feb. 20, 2024

(54) METROLOGY METHOD AND ASSOCIATED METROLOGY AND LITHOGRAPHIC APPARATUSES

(71) Applicant: ASML NETHERLANDS B.V., Veldhoven (NL)

(72) Inventors: Sebastianus Adrianus Goorden, Eindhoven (NL); Simon Reinald Huisman, Eindhoven (NL); Arjan Johannes Anton Beukman, Son en Breugel (NL)

(73) Assignee: ASML Netherlands B.V., Veldhoven (NL)

( * ) Notice: Subject to any disclaimer, the term of this patent is extended or adjusted under 35 U.S.C. 154(b) by 64 days.

(21) Appl. No.: 17/565,422

(22) Filed: Dec. 29, 2021

(65) Prior Publication Data
US 2022/0121128 A1    Apr. 21, 2022

Related U.S. Application Data

(63) Continuation of application No. PCT/EP2020/065135, filed on Jun. 2, 2020.

(30) Foreign Application Priority Data

Jul. 2, 2019 (EP) ..................................... 19183776

(51) Int. Cl.
  *G03F 7/00* (2006.01)
(52) U.S. Cl.
  CPC ...... *G03F 7/70625* (2013.01); *G03F 7/70633* (2013.01); *G03F 7/70641* (2013.01)
(58) Field of Classification Search
  CPC ............. G03F 7/70616; G03F 7/70625; G03F 7/70633; G03F 7/70641; G03F 7/70683;
(Continued)

(56) References Cited

U.S. PATENT DOCUMENTS 6,950,196 B2    9/2005 Fielden et al.
6,961,116 B2    11/2005 Den Boef et al.
(Continued)

FOREIGN PATENT DOCUMENTS

TW    201518871 A    5/2015
TW    201925922 A    7/2019
(Continued)

OTHER PUBLICATIONS

Menchtchikov, Boris, Reduction in overlay error from mark asymmetry using simulation, Orion, and alignment models Proc. SPIE vol. 10587, Optical Microlithography XXXI, 105870C (Mar. 20, 2018); doi: 10.1117/12.2297493, (11 pgs.).
(Continued)

*Primary Examiner* — Deoram Persaud
(74) *Attorney, Agent, or Firm* — FINNEGAN, HENDERSON, FARABOW, GARRETT & DUNNER, LLP

(57) ABSTRACT

Disclosed is a method of metrology comprising using measurement illumination to measure a target, said measurement illumination comprising a plurality of illumination conditions. The method comprises performing a first measurement capture with a first subset of said plurality of illumination conditions, e.g., each comprising a positive weighting, to obtain a first parameter value and performing a second measurement capture with a second subset of said plurality of illumination conditions, e.g., each comprising a negative weighting, to obtain a second parameter value. An optimized parameter value is determined as a weighted combination of at least the first parameter value and the second parameter value.

19 Claims, 7 Drawing Sheets

(58) Field of Classification Search
CPC .............. G06F 16/2228; G06F 16/285; G06F 16/9535; G06F 40/20; G06N 3/08; H01L 22/12; H01L 22/30
See application file for complete search history.

(56) References Cited

U.S. PATENT DOCUMENTS

| | | |
|---|---|---|
| 8,610,092 B2 | 12/2013 | Rue et al. |
| 2006/0033921 A1 | 2/2006 | Den Boef et al. |
| 2006/0066855 A1 | 3/2006 | Boef et al. |
| 2007/0139409 A1* | 6/2007 | Anderson ............... G06T 15/06 345/426 |
| 2009/0195768 A1 | 8/2009 | Bijnen et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0128249 A1 | 5/2013 | Redlitz |
| 2013/0242303 A1 | 9/2013 | Liu |
| 2013/0258310 A1 | 10/2013 | Smilde et al. |
| 2013/0271740 A1 | 10/2013 | Quintanilha |
| 2014/0168646 A1 | 6/2014 | Barak et al. |
| 2015/0046118 A1 | 2/2015 | Pandev et al. |
| 2015/0355554 A1 | 12/2015 | Mathijssen |
| 2017/0248852 A1 | 8/2017 | Warnaar et al. |
| 2017/0255738 A1* | 9/2017 | Van Leest ............. G03F 9/7003 |
| 2018/0373166 A1 | 12/2018 | Sanguinetti et al. |
| 2019/0094721 A1 | 3/2019 | Tinnemans et al. |
| 2019/0107781 A1 | 4/2019 | Tinnemans et al. |
| 2021/0263432 A1* | 8/2021 | Iwai ...................... G03F 9/7023 |

FOREIGN PATENT DOCUMENTS

| | | |
|---|---|---|
| WO | WO 2009078708 A1 | 6/2009 |
| WO | WO 2009106279 A1 | 9/2009 |
| WO | WO 2013178422 A1 | 12/2013 |
| WO | WO 2015051970 A1 | 4/2015 |
| WO | WO 2016030031 A1 | 3/2016 |
| WO | WO 2018095705 A1 | 5/2018 |

OTHER PUBLICATIONS

Office Action issued by the Intellectual Property Office (IPO) of ROC (Taiwan) in related Patent Application No. 109121479, dated Jun. 22, 2021, (11 pgs.).

International Search Report and Written Opinion issued by the International Searching Authority issued in related International Application No. PCT/EP2020/065135, dated Sep. 25, 2020 (10 pgs.).

\* cited by examiner

METROLOGY METHOD AND ASSOCIATED METROLOGY AND LITHOGRAPHIC APPARATUSES

CROSS-REFERENCE TO RELATED APPLICATION

The application claims priority of International Application No. PCT/EP2020/065135, filed on Jun. 2, 2020, which claims priority of EP application 19183776.4, filed on Jul. 2, 2019, all of which are incorporated herein by reference in their entireties.

FIELD

The embodiments of the present disclosure relate to methods and apparatus usable, for example, in the manufacture of devices by lithographic techniques, and to methods of manufacturing devices using lithographic techniques. The embodiments of the present disclosure relate more particularly to metrology sensors and lithography apparatuses having such a metrology sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279, which documents are hereby incorporated by reference in their entireties. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In some metrology applications, such as in some scatterometers or alignment sensors, imperfections in metrology targets can result in a wavelength/polarization dependent variation in a measured value from that target. As such, correction and/or mitigation for this variation is sometimes affected by performing the same measurement using multiple different wavelengths and/or polarizations (or more generally, multiple different illumination conditions). It would be desirable to improve one or more aspects of measuring using multiple illumination conditions.

SUMMARY

In some embodiments, a method of metrology is provided, the method comprising using measurement illumination to measure a target, said measurement illumination comprising a plurality of illumination conditions; said method comprising: performing a first measurement capture with a first subset of said plurality of illumination conditions, to obtain a first parameter value; performing a second measurement capture with a second subset of said plurality of illumination conditions, to obtain a second parameter value; and determining an optimized parameter value as a weighted combination of at least the first parameter value and the second parameter value.

In some embodiments, a metrology apparatus and a lithographic apparatus can comprise a metrology device being operable to perform the method described above.

The above and other aspects of the present disclosure will be understood from a consideration of the examples described below.

BRIEF DESCRIPTION OF THE DRAWINGS

Embodiments of the present disclosure will now be described, by way of example only, with reference to the accompanying drawings, in which.

DETAILED DESCRIPTION OF EMBODIMENTS

Before describing embodiments in detail, it is instructive to present an example environment in which embodiments of the present disclosure may be implemented.

Figure 1:
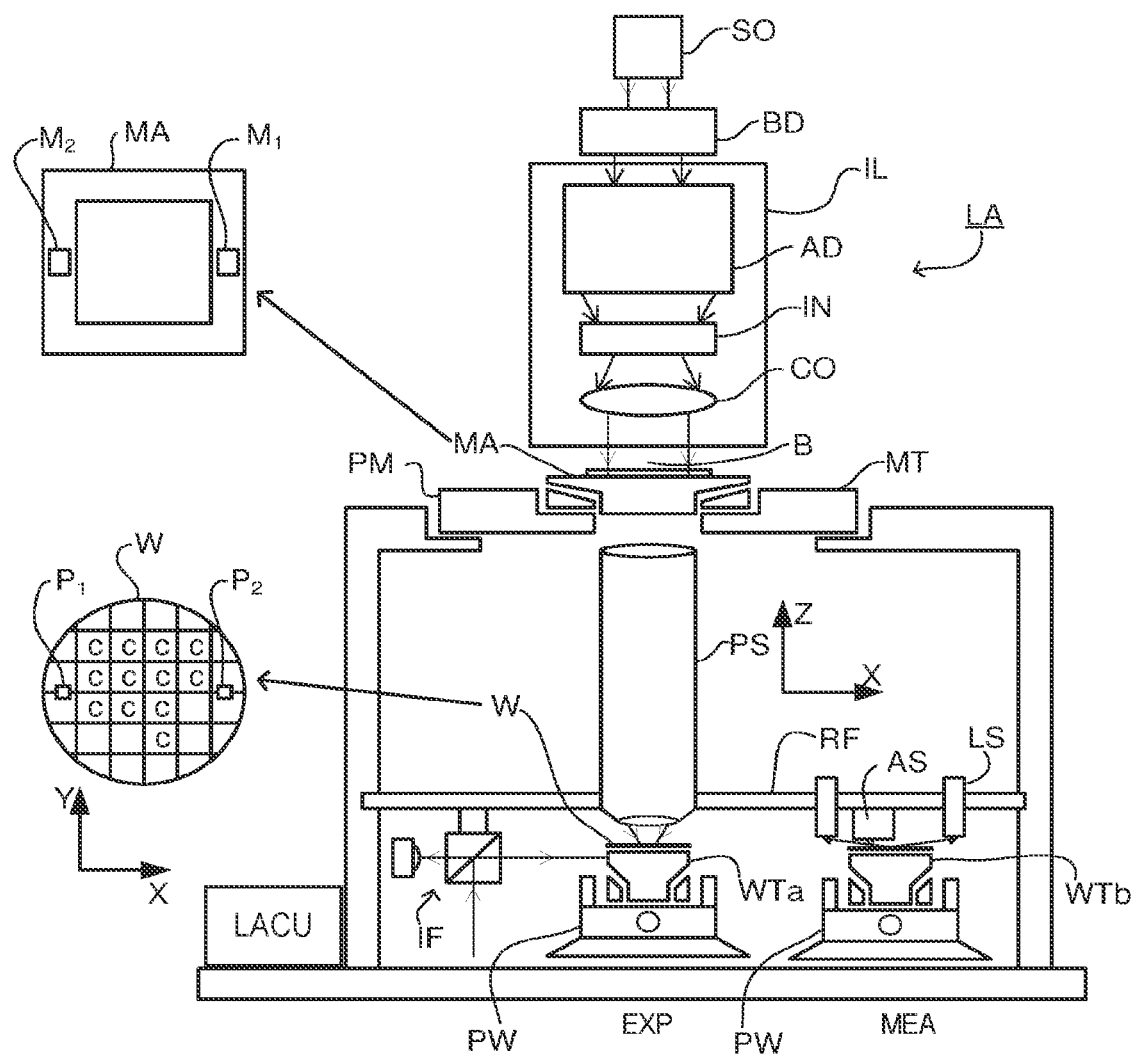
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components and serves as a reference for setting and measuring positions of the patterning device and substrate and of features on them.

The illumination system may include various types of optical components, such as refractive, reflective, magnetic, electromagnetic, electrostatic, or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic, and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder, or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above-described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
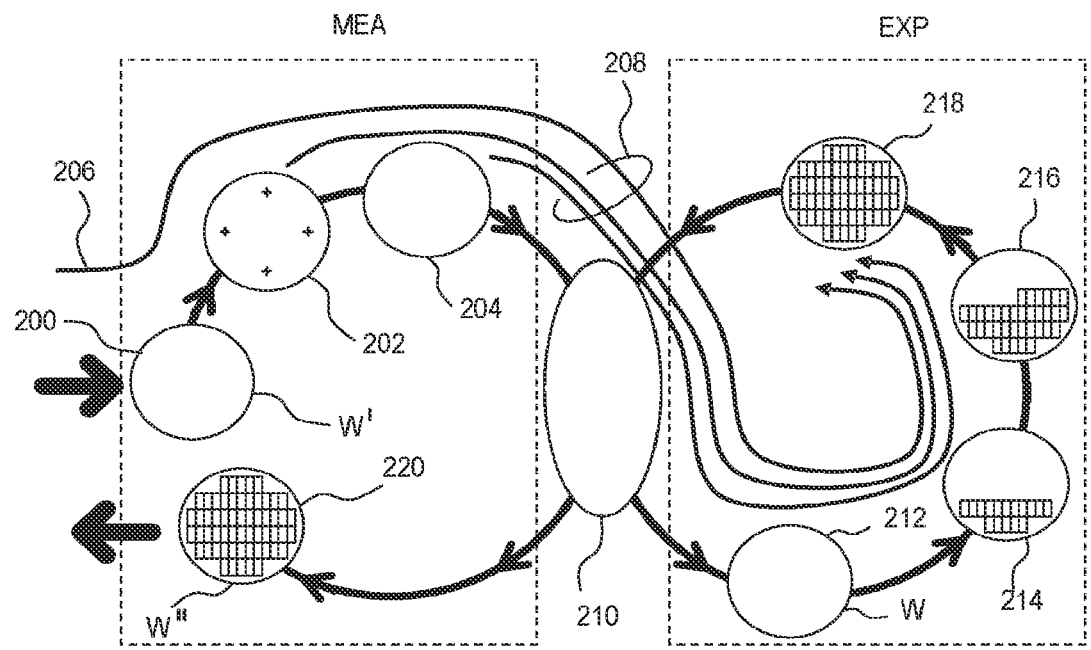
FIG. 2 illustrates schematically measurement and exposure processes in the apparatus of FIG. 1.

FIG. 2 illustrates the steps to expose target portions (e.g., dies) on a substrate W in the dual stage apparatus of FIG. 1. On the left-hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore, some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in some embodiments to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example, rather than measuring alignment in a single pass, often there will be separate phases of coarse and fine measurement, using the same or different marks. The coarse and/or fine alignment measurement steps can be performed before or after the height measurement or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g., a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
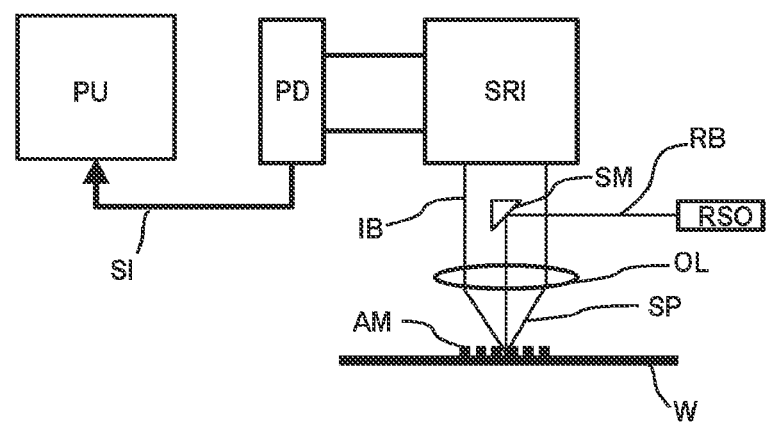
FIG. 3 is a schematic illustration of an alignment sensor adaptable according to some embodiments of the present disclosure.

FIG. 3 is a schematic block diagram of an example of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g., of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided. Improvements in performing and processing such multiple wavelength measurements are disclosed below.

Another specific type of metrology sensor, which has both alignment and product/process monitoring metrology applications, has recently been recently described in European applications EP18195488.4 and EP19150245.9, which are incorporated herein by reference. This describes a metrology device with optimized coherence. More specifically, the metrology device is configured to produce a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions.

Such a metrology device is able to measure small pitch targets with acceptable (minimal) interference artifacts (speckle) and will also be operable in a dark-field mode. Such a metrology device may be used as a position or alignment sensor for measuring substrate position (e.g., measuring the position of a periodic structure or alignment mark with respect to a fixed reference position). However, the metrology device is also usable for measurement of overlay (e.g., measurement of relative position of periodic structures in different layers, or even the same layer in the case of stitching marks). The metrology device is also able to measure asymmetry in periodic structures, and therefore could be used to measure any parameter which is based on a target asymmetry measurement (e.g., overlay using diffraction-based overlay (DBO) techniques or focus using diffraction-based focus (DBF) techniques).

Figure 4:
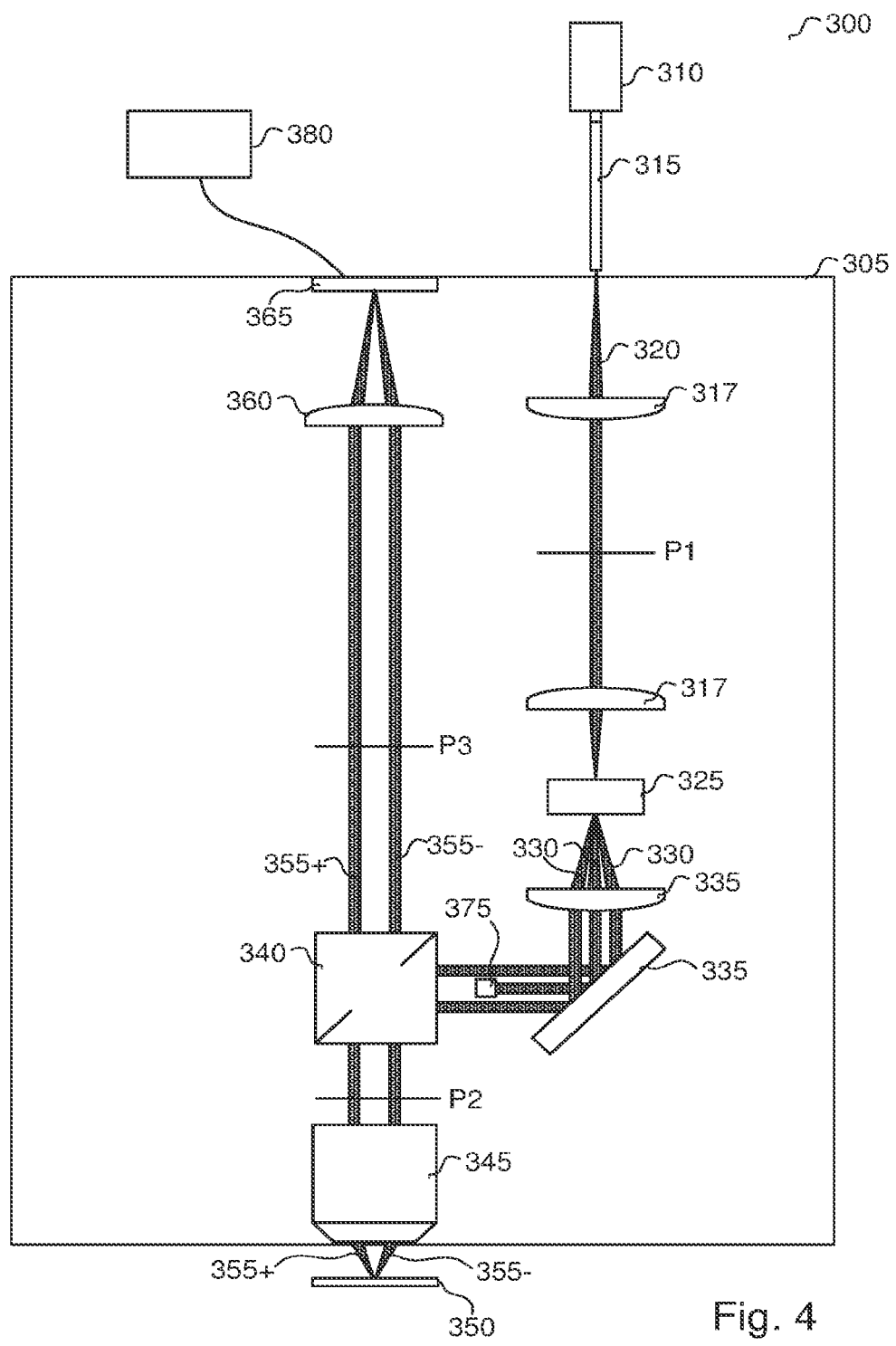
FIG. 4 is a schematic illustration of an alternative metrology device adaptable according to some embodiments of the present disclosure.

FIG. 4 shows a possible implementation of such a metrology device. The metrology device essentially operates as a standard microscope with a novel illumination mode. The metrology device 300 comprises an optical module 305 comprising the main components of the device. An illumination source 310 (which may be located outside the module 305 and optically coupled thereto by a multimode fiber 315) provides a spatially incoherent radiation beam 320 to the optical module 305. Optical components 317 deliver the spatially incoherent radiation beam 320 to a coherent off-axis illumination generator 325. This component is of particular importance to the concepts herein and will be described in greater detail. The coherent off-axis illumination generator 325 generates a plurality (e.g., four) off-axis beams 330 from the spatially incoherent radiation beam 320. The characteristics of these off-axis beams 330 will be described in detail further below. The zeroth order of the illumination generator may be blocked by an illumination zero order block element 375. This zeroth order will only be present for some of the coherent off-axis illumination generator examples described in this document (e.g., phase grating based illumination generators), and therefore may be omitted when such zeroth order illumination is not generated. The off-axis beams 330 are delivered (via optical components 335 and) a spot mirror 340 to an (e.g., high NA) objective lens 345. The objective lens focuses the off-axis beams 330 onto a sample (e.g., periodic structure/alignment mark) located on a substrate 350, where they scatter and diffract. The scattered higher diffraction orders 355+, 355− (e.g., +1 and −1 orders respectively), propagate back via the spot mirror 340, and are focused by optical component 360 onto a sensor or camera 365 where they interfere to form an interference pattern. A processor 380 running suitable software can then process the image(s) of the interference pattern captured by camera 365.

The zeroth order diffracted (specularly reflected) radiation is blocked at a suitable location in the detection branch; e.g., by the spot mirror 340 and/or a separate detection zero-order block element. It should be noted that there is a zeroth order reflection for each of the off-axis illumination beams, i.e., in the current example there are four of these zeroth order reflections in total. An example aperture profile suitable for blocking the four zeroth order reflections is shown in FIGS. 4(b) and (c), labeled 422. As such, the metrology device operated as a "dark field" metrology device.

A main concept of the proposed metrology device is to induce spatial coherence in the measurement illumination only where required. More specifically, spatial coherence is induced between corresponding sets of pupil points in each of the off-axis beams 330. More specifically, a set of pupil points comprises a corresponding single pupil point in each of the off-axis beams, the set of pupil points being mutually spatially coherent, but where each pupil point is incoherent with respect to all other pupil points in the same beam. By optimizing the coherence of the measurement illumination in this manner, it becomes feasible to perform dark-field off-axis illumination on small pitch targets, but with minimal speckle artifacts as each off-axis beam 330 is spatially incoherent.

Figure 5:
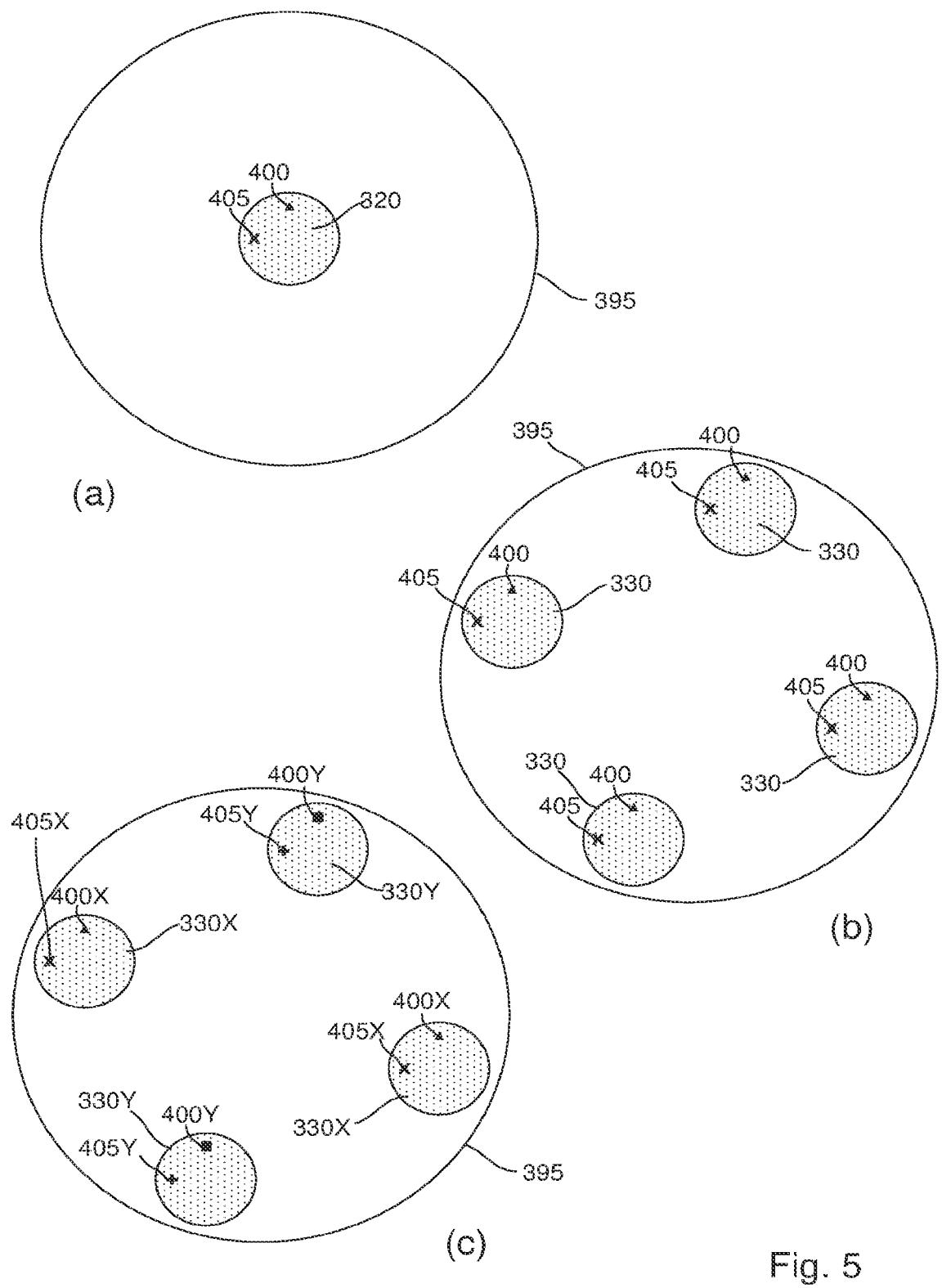
FIG. 5 comprises (a) a pupil image of input radiation (b) pupil image of off-axis illumination beams illustrating an operational principle of the metrology device of FIG. 4; and (c) pupil image of off-axis illumination beams illustrating another operational principle of the metrology device of FIG. 4.

FIG. 5 shows three pupil images to illustrate the concept. FIG. 5(a) shows a first pupil image which relates to pupil plane P1 in FIG. 4, and FIGS. 5(b) and 5(c) each show a second pupil image which relates to pupil plane P2 in FIG. 4. FIG. 5(a) shows (in cross-section) the spatially incoherent radiation beam 320, and FIGS. 5(b) and 5(c) show (in cross-section) the off-axis beams 330 generated by coherent off-axis illumination generator 325 in two different embodiments. In each case, the extent of the outer circle 395 corresponds to the maximum detection NA of the microscope objective; this may be, purely by way of an example 0.95 NA.

The triangles 400 in each of the pupils indicate a set of pupil points that are spatially coherent with respect to each other. Similarly, the crosses 405 indicate another set of pupil points which are spatially coherent with respect to each other. The triangles are spatially incoherent with respect to crosses and all other pupil points corresponding to beam propagation. The general principle (in the example shown in FIG. 5(b)) is that each set of pupil points which are mutually spatially coherent (each coherent set of points) have identical spacings within the illumination pupil P2 as all other coherent sets of points. As such, in this example, each coherent sets of points is a translation within the pupil of all other coherent sets of points.

In FIG. 5(b), the spacing between each pupil point of the first coherent set of points represented by triangles 400 must be equal to the spacing between each pupil point of the coherent set of points represented by crosses 405. 'Spacing' in this context is directional, i.e., the set of crosses (second set of points) is not allowed to be rotated with respect to the set of triangles (first set of points). As such, each of the off-axis beams 330 comprises by itself incoherent radiation; however, the off-axis beams 330 together comprise identical beams having corresponding sets of points within their cross-section that have a known phase relationship (spatial coherence). It should be noted that it is not necessary for the points of each set of points to be equally spaced (e.g., the spacing between the four triangles 405 in this example is not required to be equal). As such, the off-axis beams 330 do not have to be arranged symmetrically within the pupil.

FIG. 5(c) shows that this basic concept can be extended to providing for a mutual spatial coherence between only the beams corresponding to a single measurement direction where beams 330X correspond to a first direction (X-direction) and beams 330Y correspond to a second direction (Y-direction). In this example, the squares and plus signs each indicate a set of pupil points which correspond to, but are not necessarily spatially coherent with, the sets of pupil points represented by the triangles and crosses. However, the crosses are mutually spatially coherent, as are the plus signs, and the crosses are a geometric translation in the pupil of the plus signs. As such, in FIG. 5(c), the off-axis beams are only pair-wise coherent.

In this example, the off-axis beams are considered separately by direction, e.g., X direction 330X and Y direction 330Y. The pair of beams 330X which generate the captured X direction diffraction orders need only be coherent with one another (such that pair of points 400X are mutually coherent, as are pair of points 405X). Similarly, the pair of beams 330Y which generate the captured Y direction diffraction orders need only be coherent with one another (such that pair of points 400Y are mutually coherent, as are pair of points 405Y). However, there does not need to be coherence between the pairs of points 400X and 400Y, nor between the pairs of points 405X and 405Y. As such there are pairs of coherent points comprised in the pairs of off-axis beams corresponding to each considered measurement direction. As before, for each pair of beams corresponding to a measurement direction, each pair of coherent points is a geometric translation within the pupil of all the other coherent pairs of points.

When making a measurement of a target, for example in alignment or to measure overlay (or other parameter of interest such as focus), unwanted contributions from the target affect the measurement signal, which have an impact on the measured position or overlay value. In an ideal situation, all wavelengths used in a multi-wavelength measurement would produce the same alignment position indications or overlay value for a target on a geometrically perfect substrate. Concentrating now on alignment applications, the effect of the unwanted contributions is a wavelength dependent alignment position deviation (APD), such that different colors result in different position indications for a real (i.e., non-perfect) substrate. Such contributions comprise, for example:

Grating asymmetry—unwanted grating asymmetry, for example in the form of floor tilt in the bottom grating or unequal side wall angles, cause a wavelength dependent APD. Due to similar length scales, APD varies slowly as a function of wavelength.

Thickness variation and sensor aberrations—Layer thickness variation and interference within a stack can redistribute light within the pupil, which in combination with sensor aberrations causes APD. If, for example, the optical thickness within a stack is in the order of 1 μm, then a typical length scale at which APD varies as a function of wavelength is in the order of 150 nm.

Residual topography and surface roughness—When the wafer quality is low, topography and surface roughness can cause APD, which due to interference, is wavelength dependent. The typical length scale for APD variation is much the same as for layer thickness (150 nm for a 1 μm thick stack).

In each case, measuring at a plurality of different wavelengths (e.g., suitably far apart, and having some within the length scales described above) can enable correction for or mitigation for APD. Earlier solutions typically attempted to determine the most accurate wavelength for a particular target/stack and use this. An improved solution, described in more detail in US publication US2019/0094721 A1 (which is incorporated herein by reference), comprises a technique referred to as optimal color weighting (OCW).

It should be appreciated that APD scales differently for different colors (e.g., wavelengths or polarizations) as well as depending on layer thickness variations and the type of target being measured. OCW based methods aim to determine an optimal (e.g., weighted) combination of all the colors used to minimize the impact of target deformations on a measurement value.

Using an alignment example, for a measurement using K colors, an optimized measured position $x_{opt}$ may be calculated by a linear weighted combination of each measured position $x_k$; for example:

$$x_{opt} = \sum_{k=1}^{K} W_k x_k$$

where $W_k$ is the weighting. In some embodiments, the sum of the weights equals 1. The weighting may be determined such that $$\frac{\partial x_{opt}}{\partial p_j} = 0 \text{ for all } j,$$

where $\partial p_1, \partial p_2, \partial p_3 \ldots$ are process variations (e.g., grating asymmetry variation, layer thickness variation and surface topology variation).

$$\frac{\partial x_{opt}}{\partial p_j} = 0$$

means that the alignment position $x_{opt}$ is not affected by (small) surface variations $p_j$.

Figure 6:
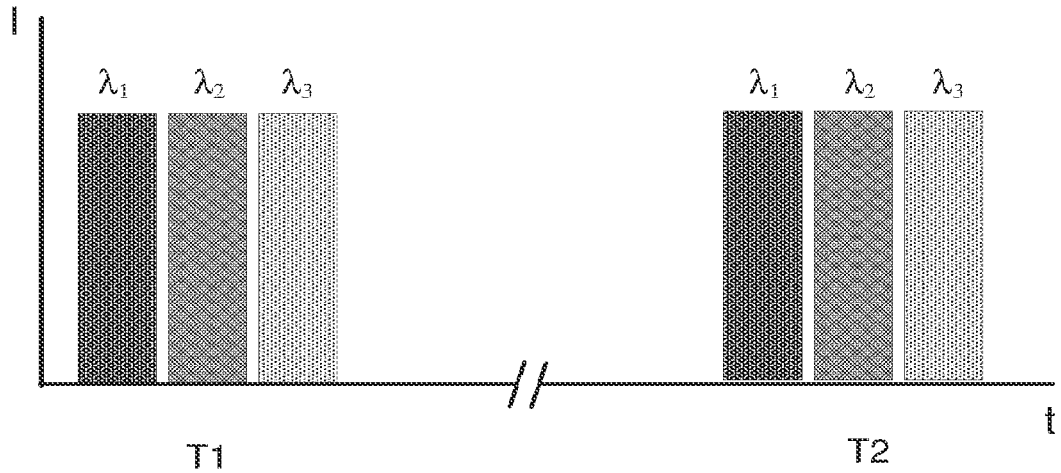
FIG. 6 is a plot of intensity against time for a measurement scheme based on sequential measurements at different wavelengths.
Figure 7:
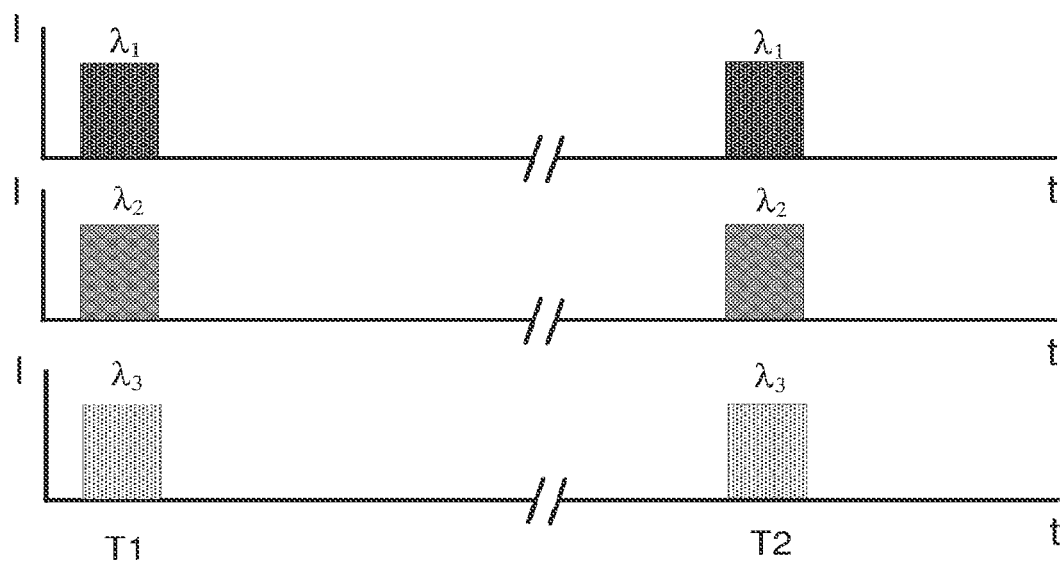
FIG. 7 is a plot of intensity against time for a measurement scheme based on parallel measurements at different wavelengths.

There are a number of different solutions presently employed for obtaining the measurement data for multiple wavelengths. FIG. 6 is a plot of intensity against time illustrating a first measurement scheme and shows measurements of a first target T1 and second target T2. Here each full measurement of a target comprises sequential measurement captures at each of three wavelengths $\lambda_1, \lambda_2, \lambda_3$ (e.g., on a single detector or camera). The colors used for each full measurement may be continuously tunable, and the number of wavelengths measured per target may vary from three. A second example is illustrated in FIG. 7, where each measurement capture for each wavelength $\lambda_1, \lambda_2, \lambda_3$ is performed in parallel, with each wavelength intensity captured on a separate detector or camera.

Figure 8:
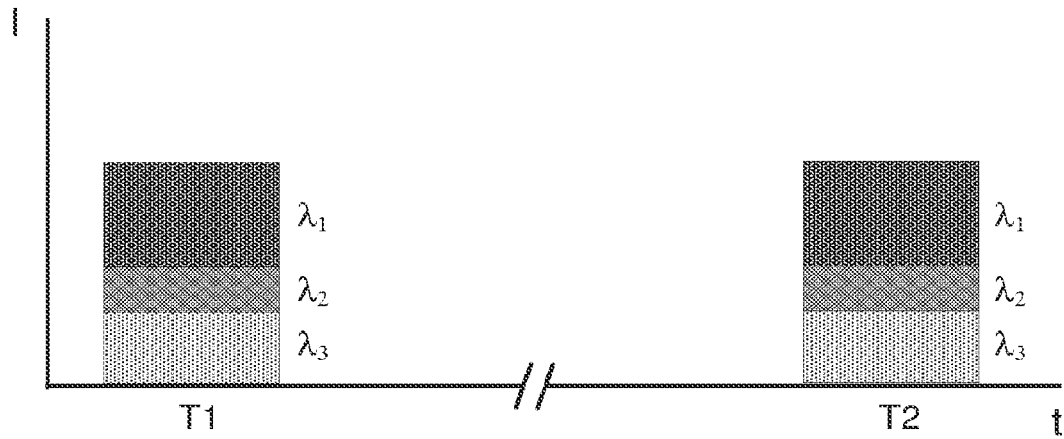
FIG. 8 shows (a) a plot of intensity against time for a measurement scheme based on optimal illumination weighting with multiple measurements at different wavelengths integrated on a single detector; and (b) a plot of intensity against position illustrating how optimal illumination weighting works.
Figure 8:
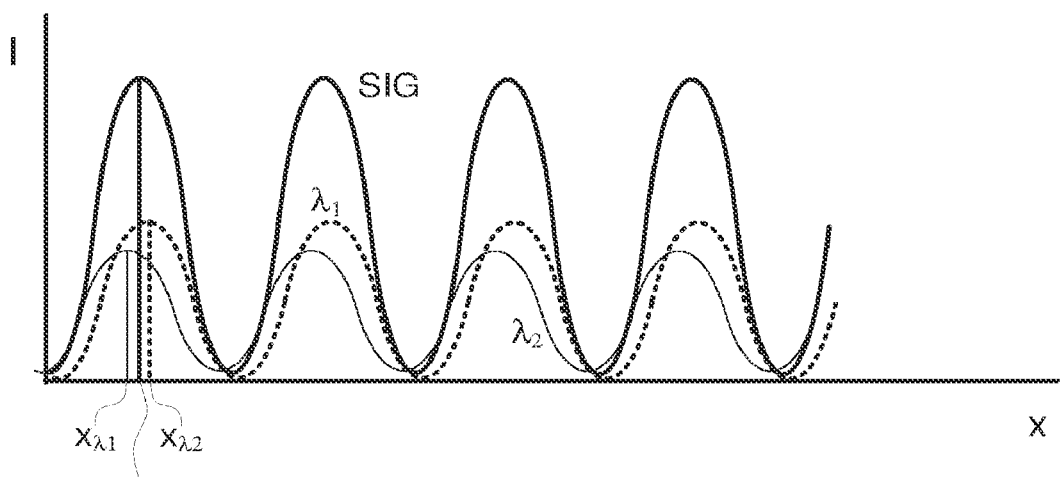

Another example comprises integrating multiple wavelengths into a single measurement capture on a single detector. This approach utilizes a concept referred to as optimal illumination weighting. This concept is illustrated by FIG. 8. FIG. 8(a) is an equivalent plot of intensity against time as those of FIGS. 6 and 7, for this optimal illumination weighting example. The three wavelengths $\lambda_1, \lambda_2, \lambda_3$ may be measured in a single capture as a combined single intensity. An example of how a single measurement position may be determined from an integrated measurement is illustrated by the plot of intensity I against position x (or time t depending on the detection arrangement) in FIG. 8(b). The intensity signals relating to each wavelength are captured with the same period on the detector but are individually weighted. For example, the signals may be weighted by setting illumination intensity per wavelength (e.g., using an acousto-optic tunable filter AOTF or similar device). In FIG. 8(b), the alignment position for the first wavelength $x_{\lambda 1}$ and for the second wavelength $x_{\lambda 2}$ (only two wavelengths are used in this example for clarity), in combination with the weighted intensities, results in the weighted alignment position $x_w$, which can be determined from the measured signal SIG.

There are a number of issues with the approaches described above. Sequential captures of different wavelengths are very difficult when the total measurement time per target should not exceed 5 ms. Measuring 5-10 colors sequentially therefore results in less than 1 ms per capture. This results in low reproducibility due to machine dynamics and low source power. Also, the speed requirements for color switching and the detector/camera would be difficult to implement and expensive. Parallel measurements have a high hardware overhead, for example 20 to 40 detectors would be required for image and pupil plane imaging at 5 to 10 colors and 2 polarizations. In particular, where the system is imaged based, 20 to 40 cameras would be required, with large volume requirements and heat generation. Each of these detectors require calibration and control for drift. Reducing the number of detectors by imaging multiple images on the camera simultaneously is possible but increases optics complexity. The optical illumination weighting has the issue that only positive weighting is possible for the colors. Therefore, the method is only properly effective for process variations which require only positive weights, such as thickness variations. This method is ineffective for grating asymmetry and other process variations which require negative color weights.

To address these issues, a method for measuring a target with N different illumination conditions (e.g., where N>2, N>3, N>4, N>5, N>8, N>15 or N>20), in only two or four measurement captures will be described which also allows for negative weights to be imposed. Different illumination conditions may comprise different wavelengths or different wavelength/polarization combinations for example. Different illumination conditions can further be extended to include other aspects of the illumination condition which can be tuned, such as the angular illumination spectrum. Furthermore, the angular spectrum could also be tuned per color (and/or polarization). This will require more complicated hardware, such as a hyperspectral illuminator (to enable tuning of the color per angle). This could be, for example, implemented using a fiber bundle which guides light from the hyperspectral illuminator to the sensor optical module. The method comprises a combination of the optical color weighting concept with separately measured colors and the optical illumination weighting with integrated colors on a detector in a single capture.

In particular, some embodiments may comprise integrating positive weighted wavelengths together (or per polarization state) and negative weighted wavelengths together (or per polarization state). As such the method may comprise integrating all of the positive weighted wavelengths in one positive-weighted capture (or two if integrated separately per polarization state) and integrating all of the negative weighted wavelengths into one negative-weighted capture (or two if integrated separately per polarization state). Each of these captures (or at least one of, depending on the required weighting) comprises multiple wavelengths integrated using essentially the same concept as the optimal illumination weighting method described before. The measured position from each of these captures can then be (e.g., linearly) combined with a weighting in a method similar to OCW.

Figure 9:
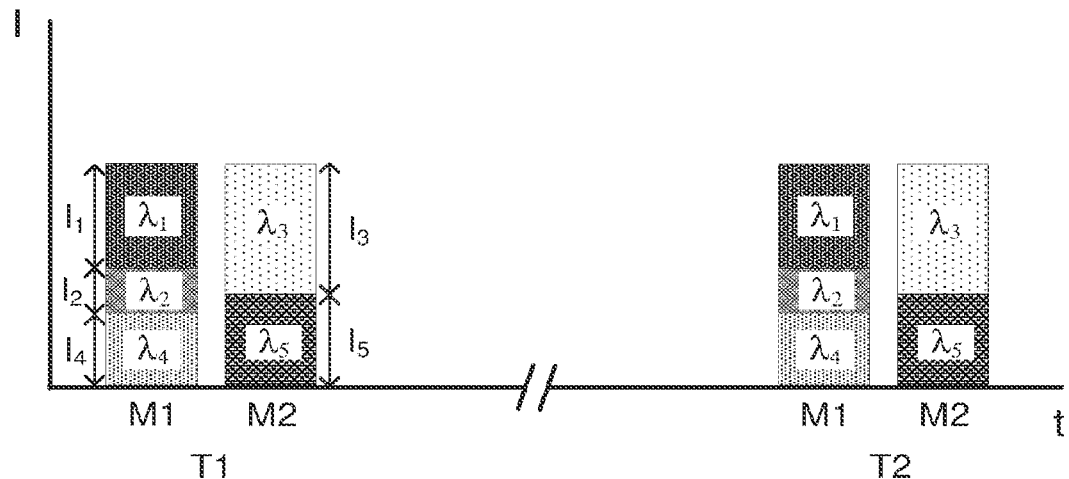
FIG. 9 is a plot of intensity against time for a measurement scheme according to some embodiments of the present disclosure.

FIG. 9 comprises a plot of intensity against time which illustrates this concept. A measurement of a first target T1 is performed with all the positive weighted wavelengths $\lambda_1, \lambda_2, \lambda_4$ in a positive-weighted capture M1 and subsequently, a measurement of the first target T1 is performed with all the negative weighted wavelengths $\lambda_3, \lambda_5$ in a negative-weighted capture M2. This is then repeated for subsequent targets (e.g., second target T2). It should be noted that one of the two captures may only comprise a single wavelength.

The weighting of the wavelengths comprised within a single capture is achieved by weighting the intensities for each of the wavelengths. As such, the period of each of the signals will be the same and the measured position from the measured signal for each capture will result from a combination of the measured positions for each constituent wavelength weighted by their respective intensities.

The measurements are then combined using the OCW concept described, but with only the two numerical weights, a first weight $W_{pos}$ for the positive-weighted capture and a second weight $W_{neg}$; i.e.:

$$x_{opt} = W_{pos} x_{pos} - W_{neg} x_{neg}$$

where $x_{pos}$ is the measured position from the positive capture and $x_{neg}$ is the measured position from the negative capture. As described, these measured positions $x_{pos}$ and $x_{neg}$ will each comprise a weighted combination (via the intensities) of the measured positions for each of the respective constituent wavelengths. Using the specific example of FIG. 9, therefore, $x_{pos} = I_1 x_1 + I_2 x_2 + I_4 x_4$ and $x_{neg} = I_3 x_3 + I_5 x_5$, where $I_1$ to $I_5$ are the weighted illumination intensities of each wavelength $\lambda_1$ to $\lambda_5$ respectively and $x_1$ to $x_5$ is the measured position which would have been obtained from a single wavelength measurement using wavelength $\lambda_1$ to $\lambda_5$, respectively The illumination weighting may be set, for example, by an AOTF in the illumination path.

Note that the treatment above is an approximated, simplified treatment which will be sufficient in many practical applications. However, a more accurate description for the specific example would be:

$$x_{pos} = c_1 I_1 x_1 + c_2 I_2 x_2 + c_4 I_4 x_4$$

$$x_{neg} = c_3 I_3 x_3 + c_5 I_5 x_5$$

where the additional coefficients $c_i$ take into account the dependency of factors such as signal strength, detector efficiency, etc., on the illumination condition (e.g., wavelength or polarization). Even this is an approximation, which is sufficiently accurate when the positions and weights do not differ too greatly. A proper treatment calculates the phase of the sum of two signs with different weights, using e.g.:

$$A\sin(\omega t + \alpha) + B\sin\omega t \begin{vmatrix} = \sqrt{A^2 + B^2 + 2AB\cos\alpha} \cdot \\ \sin\left\{\omega t + \tan^{-1}\left[\dfrac{A\sin\alpha}{A\cos(\alpha) + \beta}\right]\right\} \end{vmatrix}$$

This can be generalized and simplified by defining $x_{pos}=f(I_1x_1+I_2x_2+I_4x_4)$ and $x_{neg}=g(I_3x_3+I_5x_5)$, where f and g are suitable functions. In general, therefore, the aim of the concepts described is to choose the colors (more generally, illumination conditions) and the intensities such that the position $x_{opt}$ obtained (e.g., after applying the functions f and g and the weights W) is robust to process variations (e.g., such that the partial derivatives are 0).

Note that the number of wavelengths could be extended to around infinity, to effectively get a continuous wavelength range. In such an example, instead of using an AOTF, another type of (hyper)spectral shaper (comprising, for example, gratings and a spatial light modulator) may be used to tune the colors and weights.

The example illustrated in FIG. 9 does not include multiple polarization settings. There are many options for integrating multiple polarization settings in the concepts described herein. One possible arrangement may comprise providing two parallel detection arrangements, one per polarization state. In such an arrangement, a first measurement strategy may comprise two sequential (positive-weighted and negative-weighted) measurements as before. A consequence of this is that the wavelengths and intensity weighting will be the same for the H and V polarization states. Alternatively, four sequential measurement captures may be performed, per weighting direction and polarization combination. In such an approach, a measurement may comprise a positive-weighted H polarization capture, a positive-weighted V polarization capture, a negative-weighted H polarization capture and a negative-weighted V polarization capture. This has the advantage of enabling different colors and weights to be set for the different polarizations, albeit at a cost of doubling the measurement time. Of course, the second OCW-like calculation step will now be a weighted combination of four measurement values; i.e.:

$$x_{opt} = W_{posV}x_{posV} - W_{negV}x_{negV} + W_{posH}x_{posH} - W_{negH}x_{negH}$$

Figure 10:
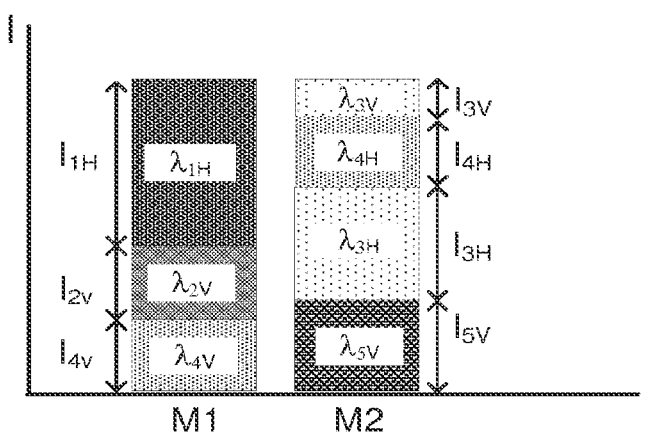
FIG. 10 is a plot of intensity against time for a measurement scheme, according to some embodiments of the present disclosure.

In another example, an illumination arrangement or illuminator may be provided which enables selection of polarization per wavelength. For example, a first AOTF may be provided to set wavelengths and weights for the H polarization and a second AOTF may be provided to set wavelengths and weights for the V polarization. The output from the first and second AOTFs can be combined into a single illumination beam (e.g., using a polarization beam splitter). The H and V measurements can be integrated on a single detector or separately detected on respective H and V detectors/cameras. FIG. 10 illustrates a measurement integrated on a single detector, comprising a positive-weighted capture M1 using a first group of wavelength/polarization combinations $\lambda 1H$, $\lambda 2V$, $\lambda 4V$ and negative-weighted capture M2 using a second group of wavelength/polarization combinations $\lambda_{3V}$, $\lambda_{4H}$, $\lambda_{3H}$, $\lambda_{5V}$. Therefore, in this example:

$$x_{opt}=W_{pos}x_{pos}-W_{neg}x_{neg} \text{(as before)}$$

where $x_{pos}=I_{1H}x_{1H}+I_{2V}x_{2V}+I_{4V}x_{4V}$ and $x_{neg}=I_{3V}x_{3V}+I_{4H}x_{4H}+I_{3H}x_{3H}+I_{5V}x_{5V}$ A method will now be described for recipe creation; i.e., to determine the wavelengths and weighting used in each measurement. The method may be similar to that already performed in OCW. It should be noted that recipe creation does not require particularly high throughput. A first step of the training method comprises separately measuring aligned positions and signal strengths for a large plurality of wavelengths (preferably, in each case, for both polarizations). This can be done sequentially, a color at a time. Enough targets/wafers/lots should be measured to obtain sufficient training data such that sufficient representative process variations will be present. An optional second step comprises exposing and measuring wafers with a metrology tool such as a scanning electron microscope or scatterometer. A third step comprises determining an optimized subset of wavelengths (or wavelength/polarization combinations) and their respective weights such that:

1) Overlay after hypothetical exposure (based on the weighted aligned position) would be minimized (this step requires actual overlay data to be available; e.g., from step 2); or
2) The weighted position correlates strongly with variations in the measured aligned position "swing curves" (which describe variation of alignment or APD with wavelength for a given target obtained through measurement and/or simulation) which can be attributed to actual mark position; e.g., the component which is consistent through wavelength and polarization such as overall offset. This weighted position preferably also has zero (or minimal) correlation with variation in the swing curves attributable to process variations (e.g., the component which varies through wavelength and polarization).

It should be noted that the intensity weighting within each capture should be corrected (in both training and production) for any signal strength variation between illumination conditions (wavelengths and/or polarizations). For example, if it has been decided that the intensities of wavelength $\lambda_1$ and wavelength $\lambda_2$ are to be weighted equally, but the signal strength (e.g., related to wafer quality) of wavelength $\lambda_1$ is twice that of wavelength $\lambda_2$, then the intensity $I_2$ of wavelength $\lambda_2$ should be made twice the intensity $I_1$ of wavelength $\lambda_1$ to compensate. This could be affected, for example, using the coefficients $c_i$ and/or functions f, g in the examples provided above.

It should be appreciated that besides data/measurement driven training, it is in principle also possible (either alternatively, or in combination) to do the training based on simulations. For example, it is possible, in principle, to train purely in the simulation domain with simulations performed on a representative wafer stack and representative (expected) process variations, so as to determine the colors and weighting. As such, any possible training method for determining colors and weighting already described in relation to known OCW techniques can also be used here.

The description above has concentrated on alignment applications for positioning a substrate (e.g., within a lithography apparatus/scanner, metrology apparatus or any other processing apparatus). In such applications, the target is commonly referred to as an alignment mark, and the metrology device referred to as an alignment sensor (such as illustrated in FIG. 3). It is to be appreciated that the concepts disclosed herein are applicable to any optical metrology application which uses multiple wavelengths and suffers from wavelength dependent errors. This may comprise metrology applications which use scatterometer based devices, for example to measure overlay or focus (or other parameter of interest) and therefore measure overlay or focus targets (whether dedicated targets or target areas of product structures). Another device to which the concepts described herein are applicable is the metrology device described in relation to FIGS. 4 and 5, which is capable of inter alia overlay/focus metrology and alignment applications. The skilled person will be able to readily adapt the teaching above for such other applications. For example, any reference to an alignment position may be substituted with an overlay/focus value or value for intensity asymmetry (or any other parameter which shows an undesired wavelength dependency). As with alignment position, these parameters should show no wavelength dependency for a single perfect target.

The order of the measurement captures in the description and/or recited in the claims is not important and should not be taken as a limitation. As such, reference to first measurement capture and second measurement capture, for example, should not be understood to describe or impose a temporal order, and it should be appreciated that the second measurement capture may be performed before the first measurement capture. In this respect "first", "second", "third", "fourth" etc. are simply used to distinguish the measurement captures (or subsets etc.) for the sake of clarity.

In conclusion, a method and measurement arrangement are described which enables measurement using a large number of colors in only two (and possibly four when polarization is also varied) measurement captures, while also facilitating negative weighting. This facilitates sub 5 ms measurement time and also the use of a relatively standard detector or camera. Wavelength/polarization flexibility is maximized, with the possibility of wavelengths/polarizations being continuously tunable. Color tuning can be implemented, for example, using one or more standard AOTFs. Furthermore, there is a N/2 times reduction in camera noise compared to separate measurement of N colors.

While specific embodiments of the present disclosure have been described above, it will be appreciated that the other embodiments may be practiced otherwise than as described.

Although specific reference may have been made above to the use of embodiments of the present disclosure in the context of optical lithography, it will be appreciated that the disclosed embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic, and electrostatic optical components. Reflective components are likely to be used in an apparatus operating in the UV and/or EUV ranges.

The breadth and scope of the embodiments of the present disclosure should not be limited by any of the above-described exemplary embodiments but should be defined at least in accordance with the following claims and their equivalents.

The invention claimed is:

1. A method of metrology comprising using measurement illumination to measure a target, said measurement illumination comprising a plurality of illumination conditions; said method comprising:
  performing a first measurement capture with a first subset of said plurality of illumination conditions, to obtain a first parameter value;
  performing a second measurement capture with a second subset of said plurality of illumination conditions, to obtain a second parameter value; and
  determining an optimized parameter value as a weighted combination of at least the first parameter value and the second parameter value,
  wherein said first subset of said plurality of illumination conditions each comprise a positive weighting and said second subset of said plurality of illumination conditions each comprise a negative weighting.

2. The method of claim 1, wherein the plurality of illumination conditions comprises at least a plurality of different wavelengths.

3. The method of claim 2, wherein each of said first subset of said plurality of illumination conditions and said second subset of said plurality of illumination conditions each comprise a first polarization state and the method further comprises:
  performing a third measurement capture with a third subset of said plurality of illumination conditions each comprising a second polarization state and a positive weighting, to obtain a third parameter value; and
  performing a fourth measurement capture with a fourth subset of said plurality of illumination conditions each comprising a second polarization state and a negative weighting, to obtain a fourth parameter value.

4. The method of claim 3, wherein said first subset of said plurality of illumination conditions, said second subset of said plurality of illumination conditions, said third subset of said plurality of illumination conditions and said fourth subset of said plurality of illumination conditions comprise non-overlapping proper subsets of said plurality of illumination conditions.

5. The method of claim 3, wherein determining the optimized parameter value comprises determining a weighted combination of the first parameter value, second parameter value, third parameter value, and fourth parameter value.

6. The method of claim 3, wherein each of said positive weighting and negative weighting is imposed by relative weighting of the intensities of each illumination condition of the corresponding subset of said illumination conditions.

7. The method of claim 1, wherein said plurality of illumination conditions comprises a plurality of different wavelength and polarization combinations.

8. The method of claim 7, wherein, for each of the first subset of illumination conditions and second subset of illumination conditions: the illumination conditions comprising a first polarization setting are selected using a first tunable filter and the illumination conditions comprising a second polarization setting are selected using a second tunable filter, with output beams from the first tunable filter and second tunable filter being subsequently combined prior to the measurement capture.

9. The method of claim 7, wherein the plurality of illumination conditions comprises a plurality of different angular illumination spectra.

10. The method of claim 1, wherein each of said positive weighting and negative weighting is imposed by relative weighting of the intensities of each illumination condition of the corresponding subset of said illumination conditions.

11. The method of claim 1, further comprising performing an initial training phase to determine said subsets and/or said weightings.

12. The method of claim 11, wherein performing the initial training phrase comprises:
generating training data comprises separately measuring parameter values for a plurality of illumination conditions of sufficient number that sufficient representative process variations will be present for training; and
determining the subsets and/or said weightings from the training data.

13. The method of claim 12, wherein determining the subsets and/or said weightings from the training data comprises determining an optimized subset of illumination conditions and respective weights such that:
a measure quality metric after hypothetical exposure based on the optimized parameter value corresponding to the optimized subset of illumination conditions and respective weights is minimized; or
the optimized parameter value corresponding to the optimized subset of illumination conditions and respective weights correlates strongly with variations in measured plots of variation in the parameter value with wavelength which are attributable to an actual value of the parameter being determined.

14. The method of claim 1, further comprising performing an alignment to determine a position value for a substrate, said optimized parameter value comprising an optimized position value.

15. The method of claim 1, further comprising performing an overlay or focus metrology method, wherein said optimized parameter value comprises an optimized overlay value or focus value.

16. A metrology device operable to perform the method of claim 1.

17. The metrology device of claim 16, further comprising an illumination system for providing the measurement illumination; and
at least one tunable filter for selecting each subset of said plurality of illumination conditions.

18. A lithographic apparatus comprises the metrology device of claim 16.

19. A lithographic apparatus comprising:
a patterning device support for supporting a patterning device;
a substrate support for supporting a substrate; and
a metrology device being operable to perform the method of claim 1.

* * * * *